US008085530B2

(12) United States Patent
Zhang et al.

(10) Patent No.: US 8,085,530 B2
(45) Date of Patent: Dec. 27, 2011

(54) MOUNTING MECHANISM AND ELECTRONIC DEVICE INCORPORATING THE SAME

(75) Inventors: Guang-Yi Zhang, Shenzhen (CN); Xiao-Zheng Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 161 days.

(21) Appl. No.: 12/756,200

(22) Filed: Apr. 8, 2010

(65) Prior Publication Data

US 2011/0141683 A1    Jun. 16, 2011

(30) Foreign Application Priority Data

Dec. 10, 2009    (CN) .......................... 2009 1 0311178

(51) Int. Cl.
*H05K 5/00* (2006.01)
*A47B 81/00* (2006.01)
*A47F 7/00* (2006.01)
(52) U.S. Cl. ......... 361/679.33; 361/679.35; 361/679.36; 361/679.37; 361/679.38; 361/679.39; 361/679.43; 361/679.44; 312/223.1; 312/223.2; 211/26
(58) Field of Classification Search .. 361/679.31–679.4, 361/679.55–679.6, 724–727; 211/26; 312/223.1, 312/223.2; 439/60, 151–160, 327, 328, 331, 439/638; 369/75.11, 75.21, 76, 77.11, 77.21, 78, 79, 80, 81, 82; 29/37
See application file for complete search history.

(56) References Cited

U.S. PATENT DOCUMENTS

| | | | |
|---|---|---|---|
| 2005/0057895 A1* | 3/2005 | Chen et al. | 361/685 |
| 2007/0019379 A1* | 1/2007 | Hsiao | 361/685 |
| 2009/0073649 A1* | 3/2009 | Ikeda et al. | 361/679.35 |

* cited by examiner

*Primary Examiner* — Jayprakash N Gandhi
*Assistant Examiner* — Jerry Wu
(74) *Attorney, Agent, or Firm* — Altis Law Group, Inc.

(57) ABSTRACT

A mounting mechanism for attaching a data storage device to a chassis includes a housing, first and second driving members, a latching member, first, second, and third elastic members. The housing defines first, second and third sliding paths therein. The first and third sliding paths extend along a first direction of the housing for receiving the first driving member and the latching member. The second sliding path extends along a second direction of the housing substantially perpendicular to the first direction for receiving the second driving member. The first driving member forms an inclined guiding surface at an end thereof outside the housing. When the guiding surface is pressed down, the driving member moves inward, driving the second driving to move and disengage from the latching member, and the latching member moves along the first direction by an elastic force of the third elastic member.

20 Claims, 7 Drawing Sheets

MOUNTING MECHANISM AND ELECTRONIC DEVICE INCORPORATING THE SAME

BACKGROUND

1. Technical Field

The disclosure generally relates to mounting mechanisms, and particularly to a mounting mechanism which facilitates attachment of a data storage device to an electronic device.

2. Description of Related Art

Data storage devices, such as hard disk drives (HDDs), compact disk-read only memory (CD-ROM) drives and digital video disc-read only memory (DVD-ROM) drives, are typically secured to a chassis of an electronic device with screws. However, attaching and detaching the data storage device with screws is unduly laborious and time-consuming.

What is desired, therefore, is a mounting mechanism for readily attaching or detaching a data storage device to or from a chassis of an electronic device.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
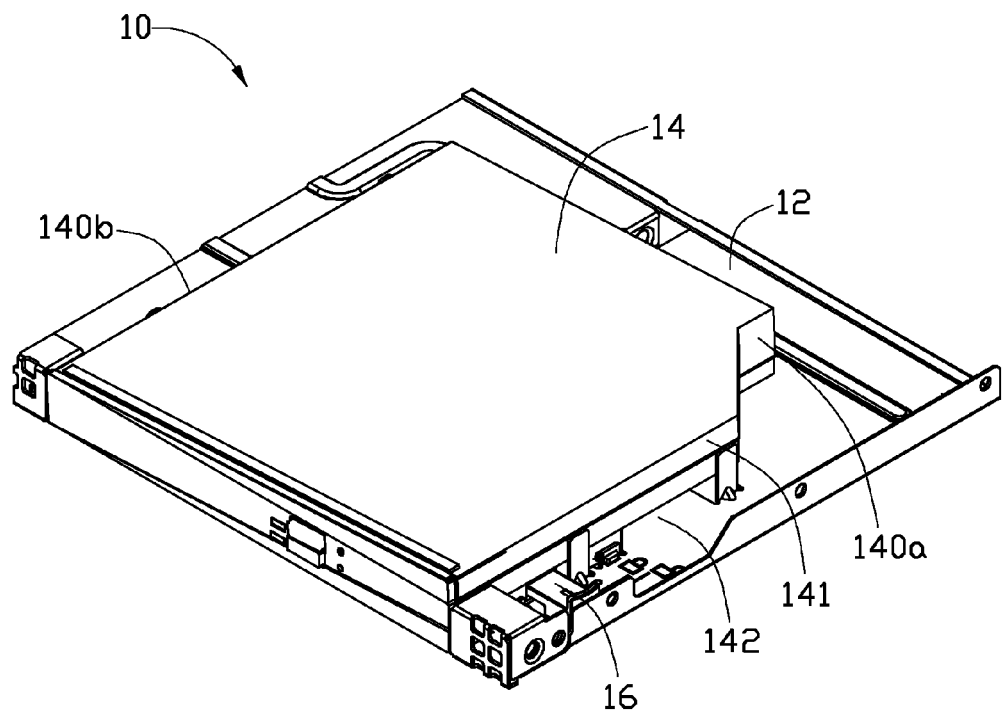
FIG. 1 is an assembled, isometric view of an electronic device in accordance with an exemplary embodiment of the present disclosure.

Referring to FIG. 1, an electronic device 10 according to an exemplary embodiment of the present disclosure includes a chassis 12, a data storage device 14, and a mounting mechanism 16 for mounting the data storage device 14 to the chassis 12.

Figure 2:
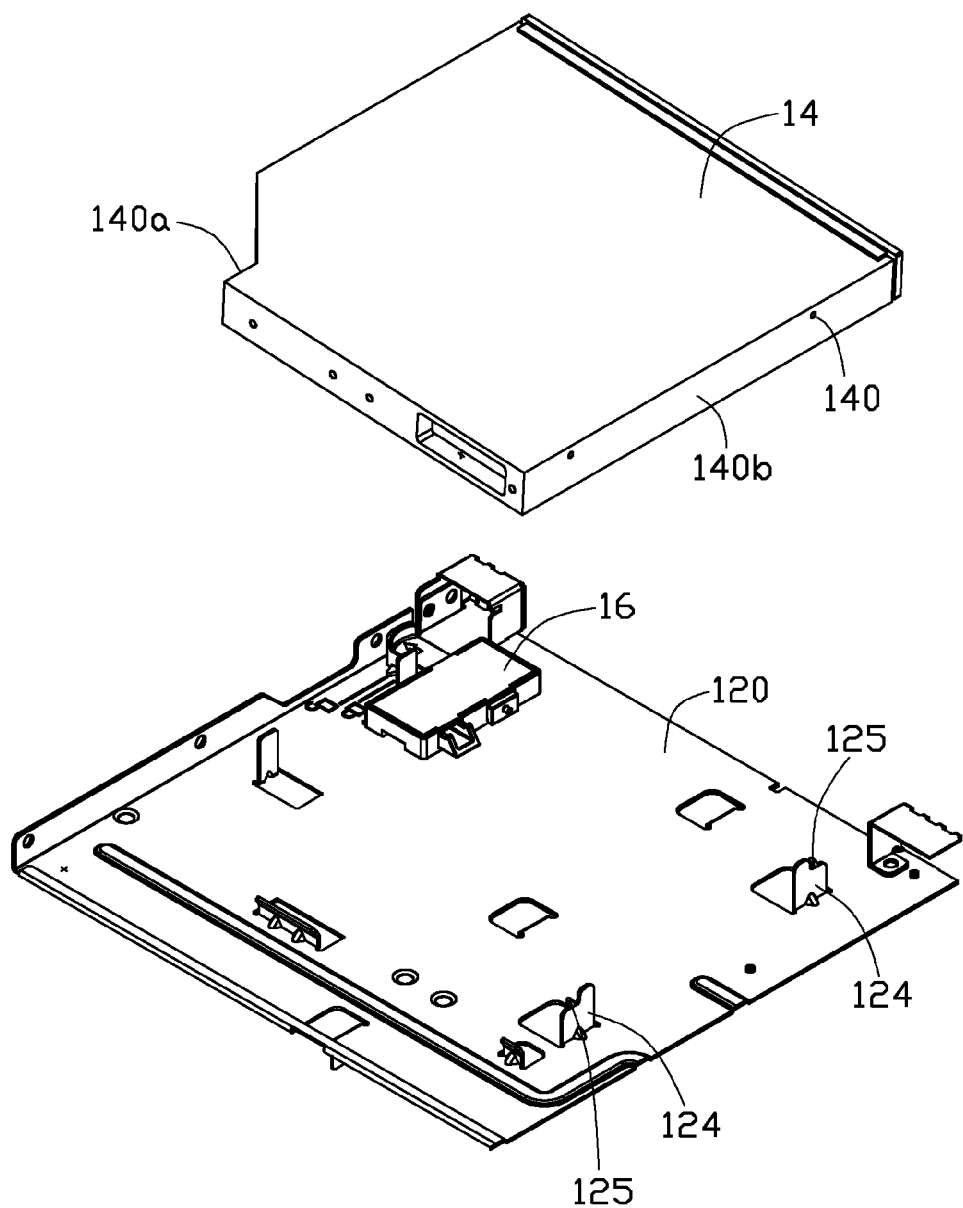
FIG. 2 is a partially exploded, isometric view of the electronic device of FIG. 1, viewed from a different aspect.
Figure 3:
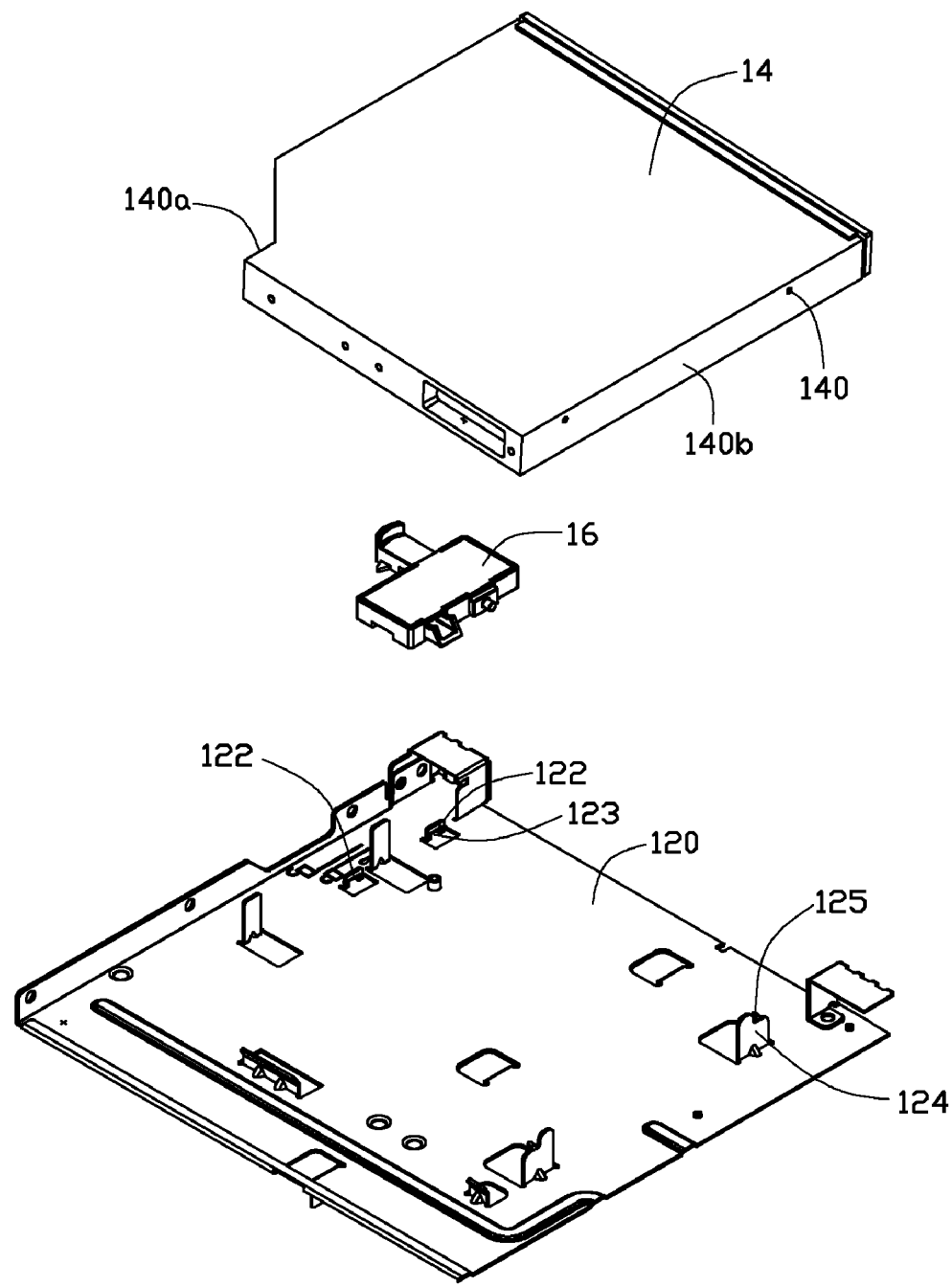
FIG. 3 is a further exploded, isometric view of the electronic device of FIG. 2.

Referring to FIGS. 2-3, the chassis 12 includes a base 120, two securing sheets 122, and two positioning sheets 124 formed on the base 120. When the data storage device 14 is mounted to the chassis 12, the two securing sheets 122 are located at a left side of the data storage device 14, and the two positioning sheets 124 are located at a right side of the data storage device 14 (as viewed in FIG. 3). The two securing sheets 122 are coplanar and are arranged adjacent to each other. Each securing sheet 122 is rectangular and defines a rectangular securing hole 123 through a low portion thereof. The two positioning sheets 124 are coplanar and spaced from each other. Each positioning sheet 124 forms a hook 125 at a top end thereof. The hook 125 extends from a middle portion of the top end of the positioning sheet 124 toward the securing sheets 122.

Referring back to FIG. 1, the data storage device 14 is disposed on the chassis 12 and arranged between the two positioning sheets 124 and the mounting mechanism 16. The data storage device 14 can be a CD-ROM drive or another electronic component, such as a HDD or a DVD-ROM drive. The data storage device 14 is a substantially rectangular box. The data storage device 14 has a first lateral surface 140a at a right side thereof and an opposite second lateral surface 140b at a left side thereof (as viewed in FIG. 1). A flange 141 extends horizontally and right from a top portion of the first lateral surface 140a of the data storage device 14. The flange 141 and the first lateral surface 140a cooperatively define a recess 142 (particularly see in FIG. 5) therebetween. The first lateral surface 140a defines a latching hole 146 (see in FIG. 5) therein at a position corresponding to the mounting mechanism 16. When the data storage device 14 is mounted to the chassis 12, the flange 141 of the data storage device 14 covers a portion of the mounting mechanism 16. The second lateral surface 140b of the data storage device 14 defines two locking holes 140 (see in FIG. 2) therein corresponding to the hooks 125 of the two positioning sheets 124.

Figure 4:
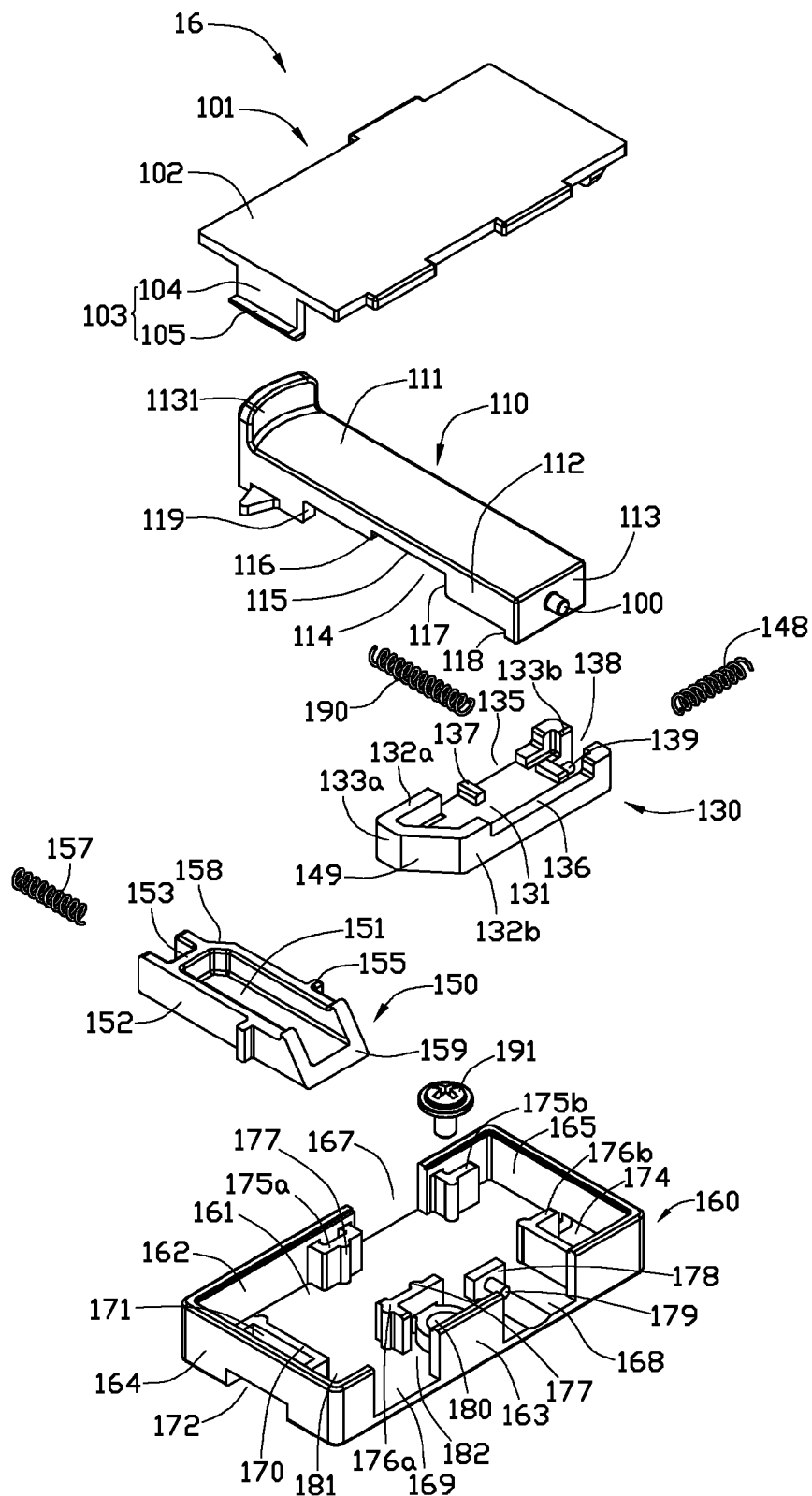
FIG. 4 is an exploded, enlarged view of a mounting mechanism of the electronic device of FIG. 3.
Figure 5:
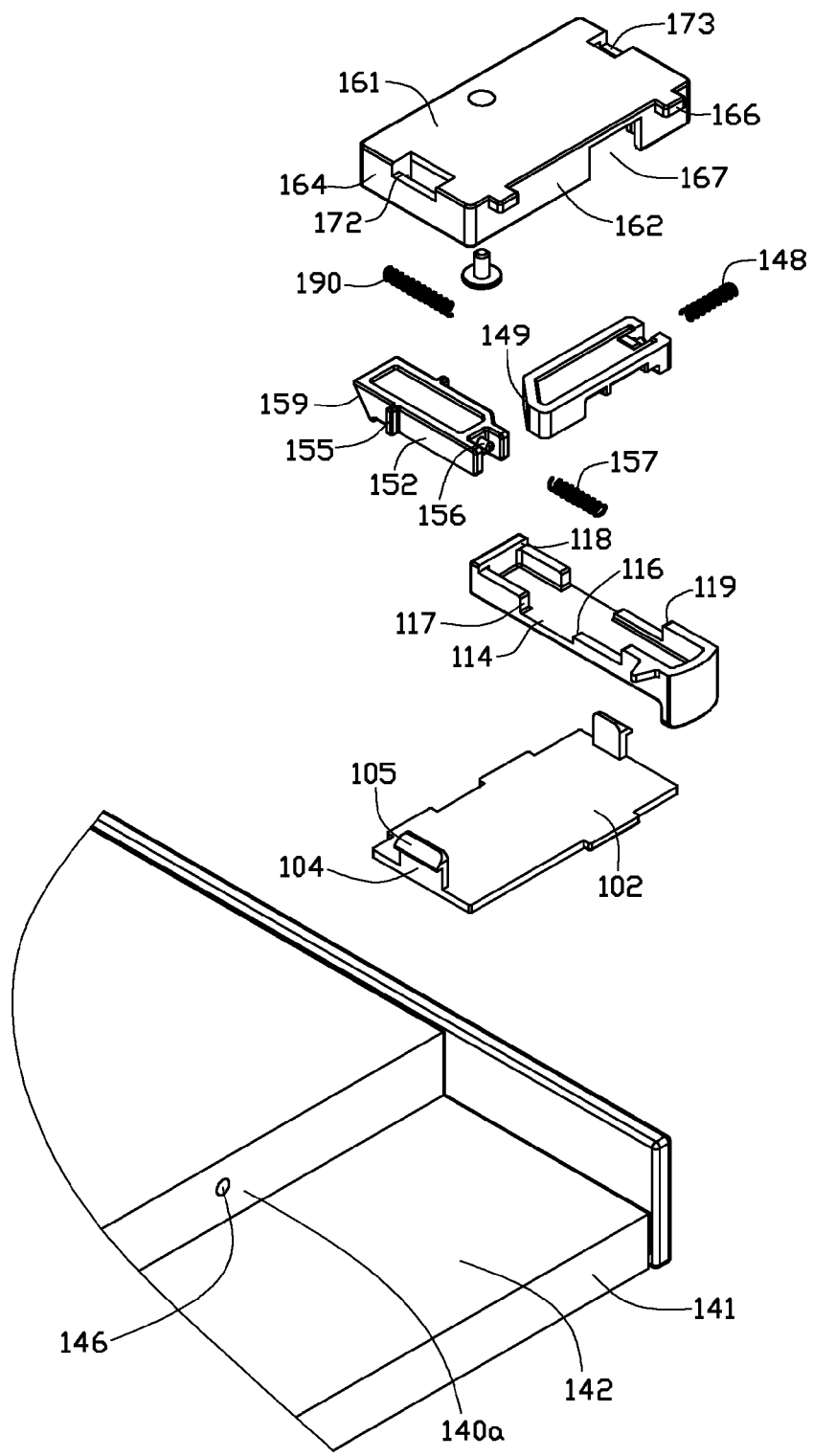
FIG. 5 is an inverted, partial and enlarged view of the electronic device of FIG. 3, with a chassis of the electronic device being omitted.

Referring to FIGS. 4-5, the mounting mechanism 16 includes a housing 160, an elongated first driving member 150, an elongated second driving member 130, an elongated latching member 110, a cover 101, a first elastic member 157, a second elastic member 148, and a third elastic member 190.

The mounting mechanism 16 is mounted to the base 120 of the chassis 12 at a position corresponding to the two securing sheets 122 via the housing 160. The housing 160 includes a substantially rectangular bottom wall 161, two parallel first sidewalls 162, 163 (i.e., a left first sidewall 162 and a right first sidewall 163) extending up from two opposite long sides of the bottom wall 161, and two parallel second sidewalls 164, 165 (i.e., a front second sidewall 164 and a rear second sidewall 165) extending up from two opposite short sides of the bottom wall 161.

An outer surface of the left first sidewall 162 forms two securing blocks 166 (see in FIG. 5) thereon corresponding to the securing holes 123 of the two securing sheets 122. A rectangular first opening 167 is defined in the left first sidewall 162 and is located between the two securing blocks 166. The first opening 167 is located adjacent to the rear second sidewall 165 and extends down from a top end of the left first sidewall 162 to an inner surface of the bottom wall 161. The right first sidewall 163 defines a rectangular second opening 168 therein corresponding to the first opening 167 of the left first sidewall 162. The second opening 168 extends down from a top end of the right first sidewall 163 to the inner surface of the bottom wall 161. The second opening 168 of the right first sidewall 163 is aligned with the first opening 167 of the left first sidewall 162. The right first sidewall 163 further defines a rectangular third opening 169 therein. The third opening 169 extends down from the top end of the right first sidewall 163 to the inner surface of the bottom wall 161 and is spaced from the second opening 168.

The front second sidewall 164 forms a rectangular first baffle 170 on an inner surface thereof, extending up from the inner surface of the bottom wall 161 and terminating below the top edge of the front second sidewall 164. The first baffle 170 is spaced from the right first sidewall 163 to define a gap 181 therebetween. An elongated through hole 171 is vertically defined in the first baffle 170. The bottom wall 161 defines a recess 172 in an outer surface thereof corresponding to and communicating with the through hole 171. The bottom wall 161 further defines another recess 173 (see in FIG. 5) in the outer surface thereof opposite to the recess 172. The recess 173 extends through a portion of the bottom wall 161, thereby defining a through hole 174 in the bottom wall 161.

The bottom wall 161 forms two opposite second baffles 175a, 175b and two opposite third baffles 176a, 176b on the inner surface thereof. The two second baffles 175a, 175b are located adjacent to and connected to the left first sidewall 162. The two second baffles 175a, 175b are arranged at two opposite sides of the first opening 167. The two third baffles 176a, 176b are located adjacent to the right first sidewall 163 and at two opposite sides of the second opening 168. The third baffle 176a is located between the second opening 168 and the third opening 169 of the right first sidewall 163. The first baffle 170, the second baffle 175a and the third baffle 176a cooperatively define a first sliding path for receiving the first driving member 150. The first sliding path extends along a latitudinal direction of the housing 160 and is aligned with the third opening 169 of the right first sidewall 163. The two second baffles 175a, 175b and the two third baffles 176a, 176b cooperatively define a second sliding path for receiving the second driving member 130. The second sliding path extends along a longitudinal direction of the housing 160 and is perpendicular to the first sliding path. The second baffles 175a, 175b each form a vertical elongated protrusion 177 thereon facing a corresponding third baffle 176a, 176b, and the third baffles 176a, 176b each form a vertical elongated protrusion 177 thereon facing a corresponding second baffle 175a, 175b. A holding block 178 is formed on the bottom wall 161 and is located between the two third baffles 176a, 176b. The holding block 178 is aligned with the first opening 167 and the second opening 168. The holding block 178 forms a column-shaped guiding pin 179 on a surface thereof facing the second opening 168. The third elastic member 190, such as a coil spring, is disposed around the guiding pin 179. The third baffle 176a is spaced from the right first sidewall 163 to define a gap 182 therebetween. A through hole 180 is defined in the bottom wall 161 and is located between the third baffle 176a and the right first sidewall 163.

The first driving member 150 includes an elongated bottom wall 151, two sidewalls 152 extending up from two opposite long sides of the bottom wall 151, and a connecting wall 153 extending up from a left end of the bottom wall 151 and connected between the two sidewalls 152. Each sidewall 152 of the first driving member 150 forms an elongated position-limitation block 155 on an outer surface thereof adjacent to a right end of the first driving member 150. The connecting wall 153 forms a column-shaped guiding pin 156 (see in FIG. 5) on an outer surface thereof. The first elastic member 157, such as a coil spring, is disposed around the guiding pin 156. The first driving member 150 forms an inclined first abutting face 158 on the outer surface of the rear sidewall 155 at a position adjacent to the connecting wall 153. The first driving member 150 forms an inclined guiding surface 159 on the right end thereof. The guiding surface 159 is located at a top side of the first driving member 150.

The second driving member 130 includes an elongated bottom wall 131, two sidewalls 132a, 132b extending up from two opposite long sides of the bottom wall 131, two connecting walls 133a, 133b extending up from two opposite short sides of the bottom wall 131. The two connecting walls 133a, 133b are located at front and rear ends of the second driving member 130 and are connected between the two sidewalls 132a, 132b. The sidewall 132a defines a first opening 135 therein corresponding to the first opening 167 of the housing 160. The first opening 135 extends down from a top end of the sidewall 132a to a top surface of the bottom wall 131. The bottom wall 131 forms a rectangular latching block 137 thereon at middle of the first opening 135. The sidewall 132b defines a second opening 136 therein corresponding to the second opening 168 of the housing 160. The second opening 136 extends down from a top end of the sidewall 132b. A depth of the second opening 136 is shorter than that of the first opening 1135. A third sliding path is defined in the housing 160 for receiving the latching member 110. The third sliding path extends along the latitudinal direction of the housing 160 and through the openings 167, 168, 135, 136.

A cutout 138 is defined vertically through the connecting wall 133b and a portion of the bottom wall 131. A horizontal guiding pin 139 is formed on a rear end of the bottom wall 161 and is received in the cutout 138. The second elastic member 148, such as a coil spring, is disposed around the guiding pin 139. The second driving member 130 forms an inclined second abutting face 149 on an outer surface of the sidewall 132b at a position adjacent to the connecting wall 133a.

The latching member 110 includes a substantially rectangular top wall 111, two first sidewalls 112 extending down from two opposite long sides of the top wall 111, and two second sidewalls 113 (i.e., a left second sidewall 113 and a right second sidewall 113) extending from two opposite short sides of the top wall 111.

A low portion of the latching member 110 is cut out to form a first step 118 adjacent to the right second sidewall 113 and a second step 119 adjacent to the left second sidewall 113. A cutout 114 is further defined in a middle of the low portion of the latching member 110. The first step 118 and the second step 119 are located lower than the cutout 114. The cutout 114 extends along the longitudinal direction of the housing 160 and through the two first sidewalls 112. The cutout 114 is defined by a horizontal top edge 115, and two vertical edges 116, 117 extending down from left and right ends of the horizontal top edge 115. A distance between the two vertical edges 116, 117 of one side is slightly longer than a width of the second driving member 130. The latching member 110 forms a column-shaped latching pin 100 on an outer surface of the right second sidewall 113. An operating portion 1131 extends up from a top end of the left second sidewall 113 of the latching member 110.

The cover 101 includes a rectangular plate 102 and two engaging portions 103 extending down from two opposite sides of the plate 102. The two engaging portions 103 are located corresponding to the through holes 171, 174 of the housing 160. Each engaging portion 103 includes an arm 104 connecting with the plate 102 and a hook 105 formed at a bottom end of the arm 104.

Figure 6:
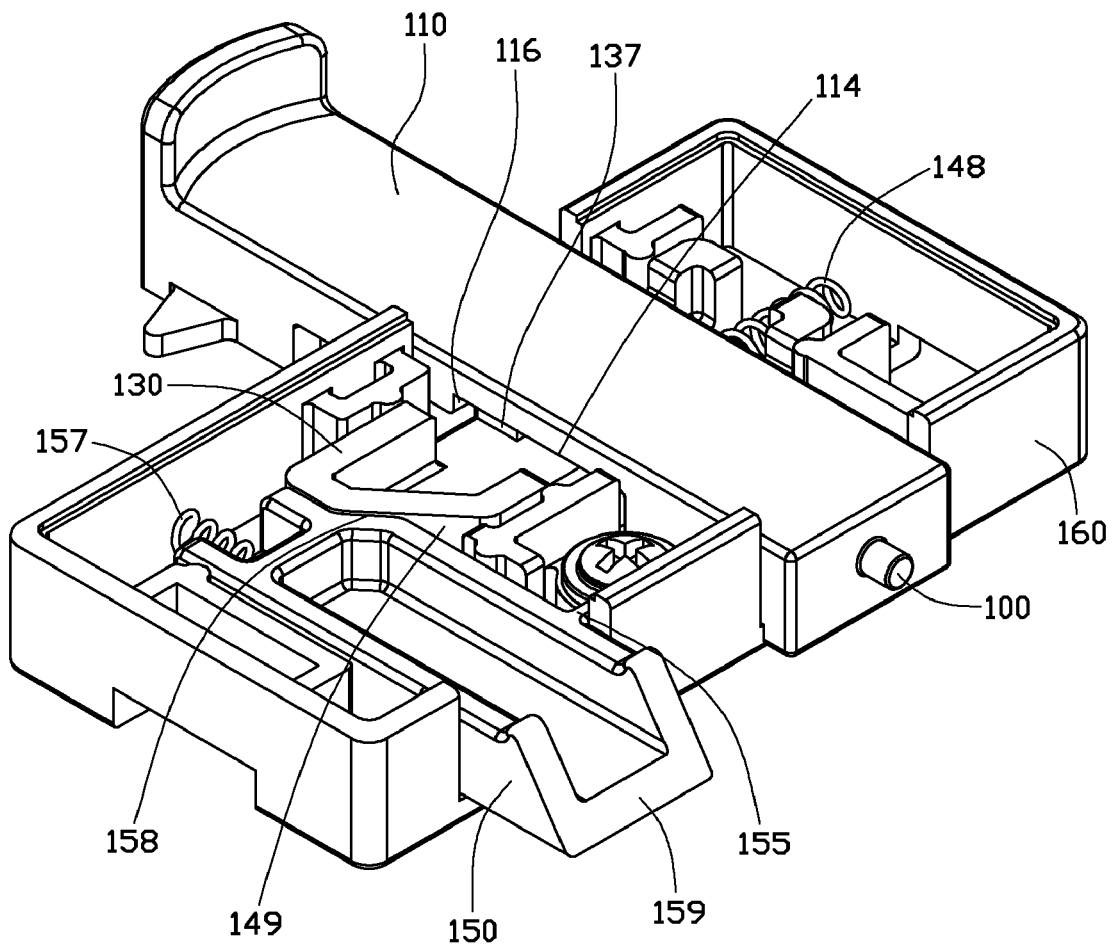
FIG. 6 is an enlarged, assembled view of the mounting mechanism of FIG. 4 illustrating a latching member thereof being located at an unlatched position, with a cover plate of the mounting mechanism being omitted.

Referring to FIGS. 2 and 6, in assembly of the mounting mechanism 16 to the chassis 12, the housing 160 is placed on the base 120 of the chassis 12, with the two securing blocks 166 of the housing 160 inserted in the securing holes 123 of the two securing sheets 122. Then, a screw 191 extends through the through hole 180 of the housing 160 and threadedly engages in the base 120, to mount the housing 160 onto the base 120. The first driving member 150 is received in the first sliding path of the housing 160, with the right end of the first driving member 150 extending out of the housing 160 through the third opening 169, the two position-limitation block 155 respectively received in the gaps 181, 182 of the housing 160, and the first elastic member 157 compressed between the left first sidewall 162 and the left end of the first driving member 150.

The second driving member 130 is received in the second sliding path of the housing 160, with the second abutting face 149 of the second driving member 130 abutting against the first abutting face 158 of the first driving member 150, and the second elastic member 148 compressed between the rear second sidewall 165 of the housing 160 and the rear end of the second driving member 130.

The latching member 110 is placed crosswise on the second driving member 130 and is received in the third sliding path of the housing 160, with two ends of the latching member 110 respectively extending out of the housing 160 through the two opening 167, 168, the third elastic member 190 compressed between the holding block 178 and the right connecting wall 113 of the latching member 110, the cutout 114 of the latching member 110 aligning with the second driving member 130, the latching block 137 of the second driving member 130 received in the cutout 114 of the latching member 110 and abutting against the vertical edges 116, and the housing 160 located between the two steps 118, 119 of the latching member 110.

The cover 101 is mounted to a top end of the housing 160, with the arms 104 of the two engaging portions 103 of the cover 101 received in the through holes 171, 174 of the housing 160, and the hooks 105 of the two engaging portions 103 of the cover 101 received in the recesses 172, 173 of the housing 160. Thus the first driving member 150, the second driving member 130 and the latching member 110 are sandwiched between the cover 101 and the bottom wall 161 of the housing 160.

Before the data storage device 14 being assembled to the chassis 12, the latching member 110 of the mounting mechanism 16 is located at an unlatched position, as shown in FIG. 6. At such position, the position-limitation blocks 155 of the first driving member 150 abut against an inner surface of the right first sidewall 163 of the housing 160. The latching block 137 of the second driving member 130 is received in the cutout 114 of the latching member 110 and engages with the latching member 110.

Figure 7:
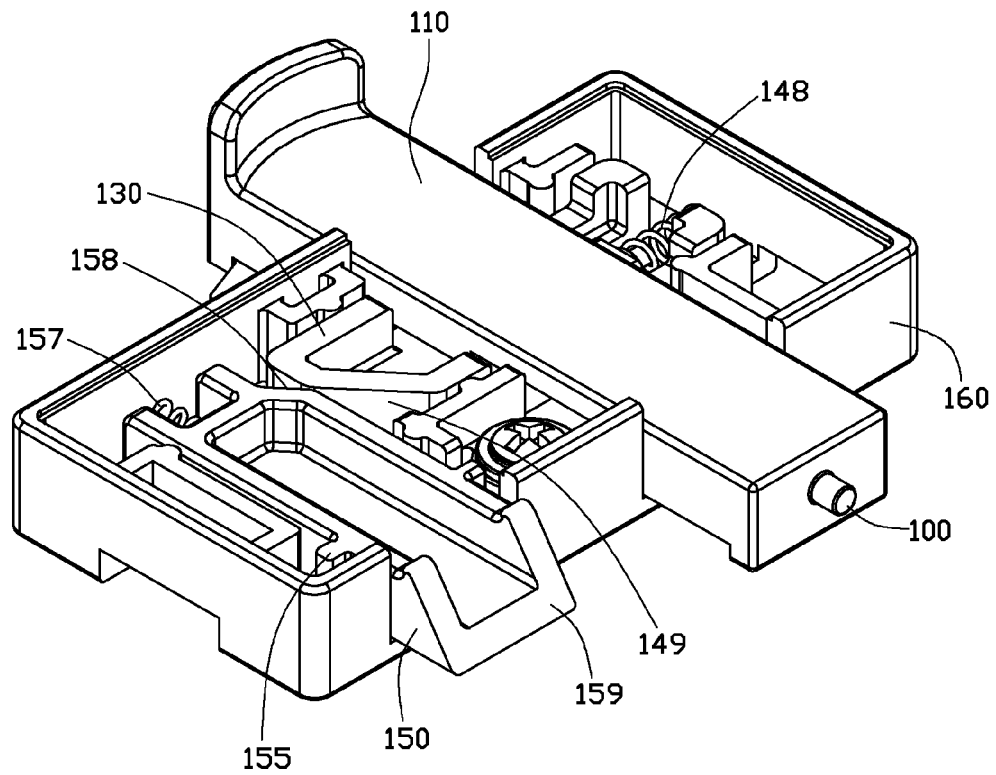
FIG. 7 is similar to FIG. 6, but shows the latching member of the mounting mechanism located at a latched position.

Referring to FIGS. 2 and 6-7, in assembly of the data storage device 14 to the chassis 12, the data storage device 14 is placed aslant on the chassis 12, with the two locking holes 140 in the second lateral surface 140b thereof receiving the hooks 125 of the two positioning sheets 124 therein. At that time, the first driving member 150 is located at a first position close to the first lateral surface 140a of the data storage device 14, with the inclined guiding surface 159 of the first driving member 150 covered by the flange 141 of the data storage device 14. The latching member 110 is located at a first position far from the first lateral surface 140a of the data storage device 14, with the latching block 137 of the second driving member 130 engaging with the latching member 110 to prevent the latching member 110 from moving toward the data storage device 14. The first lateral surface 140a of the data storage device 14 is spaced from an outer end of the latching pin 100 of the latching member 110.

Then, the flange 141 of the data storage device 14 is pressed down and slides along the inclined guiding surface 159 of the first driving member 150, driving the first driving member 150 to move horizontally relative to the housing 160. The first driving member 150 moves away from the data storage device 14 to compress the first elastic member 157. At the same time, the first abutting face 158 of the first driving member 150 slides along the second abutting face 149 of the second driving member 130, driving the second driving member 130 to move horizontally away from the first driving member 150 and compress the second elastic member 148.

After the second driving member 130 has moved horizontally a certain distance relative to the latching member 110, the latching block 137 of the second driving member 130 disengages from the latching member 110 and moves out of the cutout 114 of the latching member 110. Then, the compressed third elastic member 190 is restored to push the latching member 110 toward the first lateral surface 140a of the data storage device 14.

After the flange 141 of the data storage device 14 has moved down a certain distance, the latching pin 100 is pushed to abut against the first lateral surface 140a of the data storage device 14. When the data storage device 14 is pressed to a horizontal state, the latching pin 100 of the latching member 110 slides to and engages with the latching hole 146 of the data storage device 14, thereby mounting the data storage device 14 to the chassis 12. At that time, the latching member 110 of the mounting mechanism 16 is located at a latched position, as shown in FIG. 7. In other words, the first driving member 150 is located at a second position far from the first lateral surface 140a of the data storage device 14, and the latching member 110 is located at a second position close to the first lateral surface 140a of the data storage device 14.

To detach the data storage device 14 from the chassis 12, the operating portion 3313 of the latching member 110 is pulled outward to compress the third elastic member 190. The latching member 110 slides relative to the second driving member 130, causing the latching pin 100 of the latching member 110 to disengage from the latching hole 146 of the data storage device 14. After the latching member 110 is pulled outward a certain distance, the latching block 137 moves to the cutout 114 of the latching member 110. Then, the compressed second elastic member 148 is restored to push the second driving member 130 toward the first driving member 150. The second abutting face 149 of the second driving member 130 slides along the first abutting face 158 of the first driving member 150, driving the first driving member 150 to move toward the data storage device 14. At the same time, the compressed first elastic member 157 is restored to provide an elastic force, driving the first driving member 150 to move toward the data storage device 14. Thus, the flange 141 of the data storage device 14 is pushed up by the inclined guiding surface 159 of the first driving member 150. At that time, the data storage device 14 can be detached from the chassis 12 easily by disengaging the locking holes 140 from the hooks 125 of the chassis 12. After removing the data storage device 14 from the chassis 12, the latching block 137 of the second driving member 130 is automatically driven back to its original position by the restoring force of the second elastic member 148 and engages with the latching member 110.

In the electronic device 10, due to the presence of the mounting mechanism 16, the data storage device 14 can be readily attached to the chassis 12 by pressing the data storage device 14 down and can also be readily detached from the chassis 12 by pulling the latching member 110.

It is to be understood, however, that even though numerous characteristics and advantages of the present disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A mounting mechanism, comprising:
   a housing defining a first sliding path, a second sliding path and a third sliding path therein, the first sliding path and the third sliding path extending along a first direction of the housing, the second sliding path extending along a second direction of the housing substantially perpendicular to the first direction;

a first driving member received in the first sliding path of the housing, the first driving member having a first end extending out of the housing and an opposite second end received in the housing, the first driving member forming an inclined guiding surface at the first end thereof and an inclined first abutting face adjacent to the second end thereof facing the third sliding path;

a first elastic member providing an elastic force to drive the first driving member to move along the first direction of the housing toward the first end of the first driving member;

a second driving member received in the second sliding path of the housing, the second driving member having a first end adjacent to the first driving member and an opposite second end far from the first driving member, the second driving member forming an inclined second abutting face at the first end thereof facing the first abutting face;

a second elastic member providing an elastic force to drive the second driving member to move along the second direction of the housing toward the first driving member;

a latching member received in the third sliding path of the housing, the latching member having a first end corresponding to the first end of the first driving member and an opposite second end corresponding to the second end of the first driving member, the latching member forming a latching pin at the first end thereof; and a third elastic member providing an elastic force to drive the latching member to move along the first direction of the housing toward the first end of the latching member;

wherein when the latching member is located at an unlatched position, the second driving member engages with the latching member to prevent the latching member from moving along the first direction of the housing toward the first end of the latching member, and the first abutting face of the first driving member abuts against the second abutting face of the second driving member, and wherein when the guiding surface of the first driving member is pressed down, the driving member moves inward to drive the second driving to move relative to the latching member, the second driving member disengages from the latching member, and the latching member moves along the first direction of the housing toward the first end thereof by the elastic force of the third elastic member.

2. The mounting mechanism of claim 1, wherein the latching member defining a cutout in a low portion thereof, the second driving member forming a latching block thereon, when the latching member is located at the unlatched position, the latching block of the second driving member is received in the cutout of the latching member and engages with the latching member.

3. The mounting mechanism of claim 2, wherein the latching member comprises an elongated top wall, two opposite first sidewalls and two opposite second sidewalls extending down from a peripheral edge of the top wall, the cutout of the latching member extending through the two first sidewalls, the latching pin being formed on one of the two second sidewalls of the latching member.

4. The mounting mechanism of claim 3, wherein the housing forms a holding block thereon, the third elastic member being compressed between the holding block and the sidewall on which the latching pin is formed.

5. The mounting mechanism of claim 1, wherein the first and the second ends of the latching member extends out of the housing.

6. The mounting mechanism of claim 5, wherein the low portion of the latching member forms a first step adjacent to the first end of the latching member and a second step adjacent to the second end of the latching member, the housing being located between the first and the second steps of the latching member.

7. The mounting mechanism of claim 5, wherein the hosing comprises an elongated bottom wall, two opposite first sidewalls and two opposite second sidewalls extending up from a peripheral edge of the bottom wall, one of the two first sidewalls defining a first opening therein for extension of the second end of the latching member, the other one of the two first sidewalls defining a second opening therein for extension of the first end of the latching member and defining a third opening therein for extension of the first end of the first driving member.

8. The mounting mechanism of claim 7, wherein the bottom wall of the housing forms a first baffle, two second baffles and two third baffles, the first baffle, one of the two second baffles and one of the two third baffles cooperatively defining the first sliding path, the two second baffles and the two third baffles cooperatively define the second sliding path.

9. The mounting mechanism of claim 1, wherein the first elastic member is compressed between the housing and the second end of the first driving member, and the second elastic member is compressed between the housing and the second end of the second driving member.

10. The mounting mechanism of claim 1, further comprises a cover mounted to the housing, the first driving member, the second driving member and the latching member being sandwiched between the cover and the housing.

11. An electronic device, comprising:
a chassis comprising a base and at least one positioning sheet formed on the base;
a mounting mechanism mounted on the chassis and spaced from the at least one positioning sheet, the mounting mechanism comprising:
  a housing mounted on the base, the housing defining a first sliding path, a second sliding path and a third sliding path therein, the first sliding path and the third sliding path extending along a first direction of the housing, the second sliding path extending along a second direction of the housing substantially perpendicular to the first direction;
  a first driving member received in the first sliding path of the housing, the first driving member having a first end extending out of the housing and an opposite second end received in the housing, the first driving member forming an inclined guiding surface at the first end thereof and an inclined first abutting face adjacent to the second end thereof facing the third sliding path;
  a first elastic member providing an elastic force to drive the first driving member to move along the first direction of the housing toward the first end of the first driving member;
  a second driving member received in the second sliding path of the housing, the second driving member having a first end adjacent to the first driving member and an opposite second end far from the first driving member, the second driving member forming an inclined second abutting face at the first end thereof facing the first abutting face;
  a second elastic member providing an elastic force to drive the second driving member to move along the second direction of the housing toward the first driving member;

a latching member received in the third sliding path of the housing, the latching member having a first end corresponding to the first end of the first driving member and an opposite second end corresponding to the second end of the first driving member, the latching member forming a latching pin at the first end thereof; and a third elastic member providing an elastic force to drive the latching member to move along the first direction of the housing toward the first end of the latching member, when the mounting mechanism is mounted on the chassis and located at an unlatched position, the second driving member engages with the latching member to prevent the latching member from moving along the first direction of the housing toward the first end of the latching member, and the first abutting face of the first driving member abuts against the second abutting face of the second driving member; and a data storage device disposed on the chassis, the data storage device having a first lateral side and an opposite second lateral side, the mounting mechanism being located at the first lateral side of the data storage device, the at least one positioning sheet being located at the second lateral side of the data storage device and engaging with the second lateral side of the data storage device, the first end of the first driving member and the first end of the latching member facing the first lateral surface of the data storage device, a flange being formed on the first lateral surface of the data storage device and covering the guiding surface of first driving member, the first lateral surface defining a latching hole therein below the flange corresponding to the latching pin of the latching member;

wherein when the guiding surface of the first driving member is pressed down by the flange of the data storage device, the first driving member moves away from the data storage device, driving the second driving member to disengage from the latching member, the latching member moves toward the data storage device by the elastic force of the third elastic member, and the latching pin of the latching member slides into and engages with the latching hole of the data storage device to mount the data storage device to the chassis.

12. The electronic device of claim 11, wherein the latching member defining a cutout in a low portion thereof, the second driving member forming a latching block thereon, when the latching member is located at the unlatched position, the latching block of the second driving member is received in the cutout of the latching member and engages with the latching member.

13. The electronic device of claim 12, wherein the latching member comprises an elongated top wall, two opposite first sidewalls and two opposite second sidewalls extending down from a peripheral edge of the top wall, the cutout of the latching member extending through the two first sidewalls, the latching pin being formed on one of the two second sidewalls of the latching member.

14. The electronic device of claim 13, wherein the housing forms a holding block thereon, the third elastic member being compressed between the holding block and the sidewall on which the latching pin is formed.

15. The electronic device of claim 11, wherein the first and the second ends of the latching member extends out of the housing.

16. The electronic device of claim 15, wherein the low portion of the latching member forms a first step adjacent to the first end of the latching member and a second step adjacent to the second end of the latching member, the housing being located between the first and the second steps of the latching member.

17. The electronic device of claim 15, wherein the hosing comprises an elongated bottom wall, two opposite first sidewalls and two opposite second sidewalls extending up from a peripheral edge of the bottom wall, one of the two first sidewalls defining a first opening therein for extension of the second end of the latching member, the other one of the two first sidewalls defining a second opening therein for extension of the first end of the latching member and defining a third opening therein for extension of the first end of the first driving member.

18. The electronic device of claim 17, wherein the bottom wall of the housing forms a first baffle, two second baffles and two third baffles, the first baffle, one of the two second baffles and one of the two third baffles cooperatively defining the first sliding path, the two second baffles and the two third baffles cooperatively define the second sliding path.

19. The electronic device of claim 10, wherein the first elastic member is compressed between the housing and the second end of the first driving member, and the second elastic member is compressed between the housing and the second end of the second driving member.

20. The electronic device of claim 10, wherein the mounting mechanism further comprises a cover mounted to the housing, the first driving member, the second driving member and the latching member being sandwiched between the cover and the housing.

* * * * *